137-13. OR 3,451,408 SR

June 24, 1969 R. A. EVANS 3,451,408
CONTROL APPARATUS
Filed Sept. 8, 1966

Tong 137/13

X2380

Y2474

INVENTOR.
RICHARD A. EVANS
BY Charles J. Ungemach
ATTORNEY

United States Patent Office 3,451,408
Patented June 24, 1969

3,451,408
CONTROL APPARATUS
Richard A. Evans, Anoka, Minn., assignor to Honeywell Inc., Minneapolis, Minn., a corporation of Delaware
Filed Sept. 8, 1966, Ser. No. 578,006
Int. Cl. F15c *1/14, 1/08*
U.S. Cl. 137—81.5 2 Claims

ABSTRACT OF THE DISCLOSURE

A method of changing the gain of a fluid amplifier comprising varying the interaction region pressure by introducing additional fluid thereinto. Two amplifier embodiments employing means for varying the interaction region pressure are shown.

This invention pertains to fluidic apparatus and more particularly to a fluidic gain changing amplifier.

While fluid amplifiers per se have been known in the art for some time, only recently has much effort been exerted in designing complete control systems utilizing a number of fluidic components. With the advent of considerable system design, it becomes quite desirable that certain of the basic components be relatively flexible to facilitate their use in various systems requiring changes in system gain. Since most systems require fluid amplifiers as one of the basic building blocks, the advantage of having amplifiers capable of changing gain on command is obvious.

Two solutions to the problem of changing gain of a fluid amplifier have previously been proposed, both of which are undesirable. The first is a fluid amplifier in which the geometry is made variable by using movable walls and surfaces. Since one of the primary advantages of a fluidic device is the elimination of moving parts which are subject to wear and which reduce reliability, the first solution is basically undesirable. The second is the inclusion of a separate gain changing device in the system to adjust the gain of the amplifiers to be compatible with the requirements of the system. Since this solution involves using additional components which increase the cost and complexity of the system, it too is undesirable.

In the present invention these problems are overcome by providing a fluid amplifier whose gain can be changed by purely fluidic means. Thus no moving parts or separate components are involved. Briefly, I have discovered that the gain of a fluid amplifier can be changed by supplying additional fluid under pressure to the interaction region of the amplifier through an additional fluid inlet port provided therein.

Figure 1:
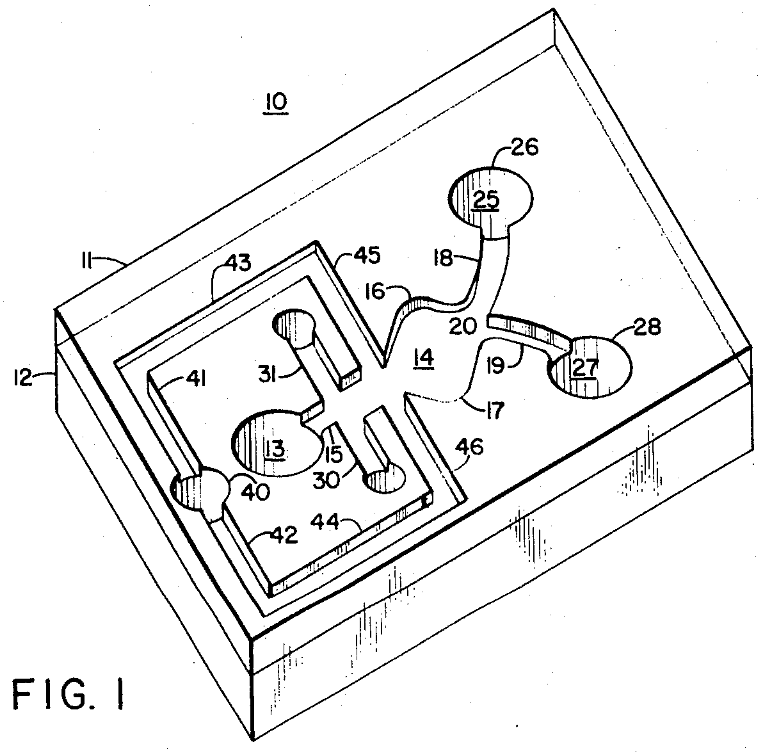
Figure 2:
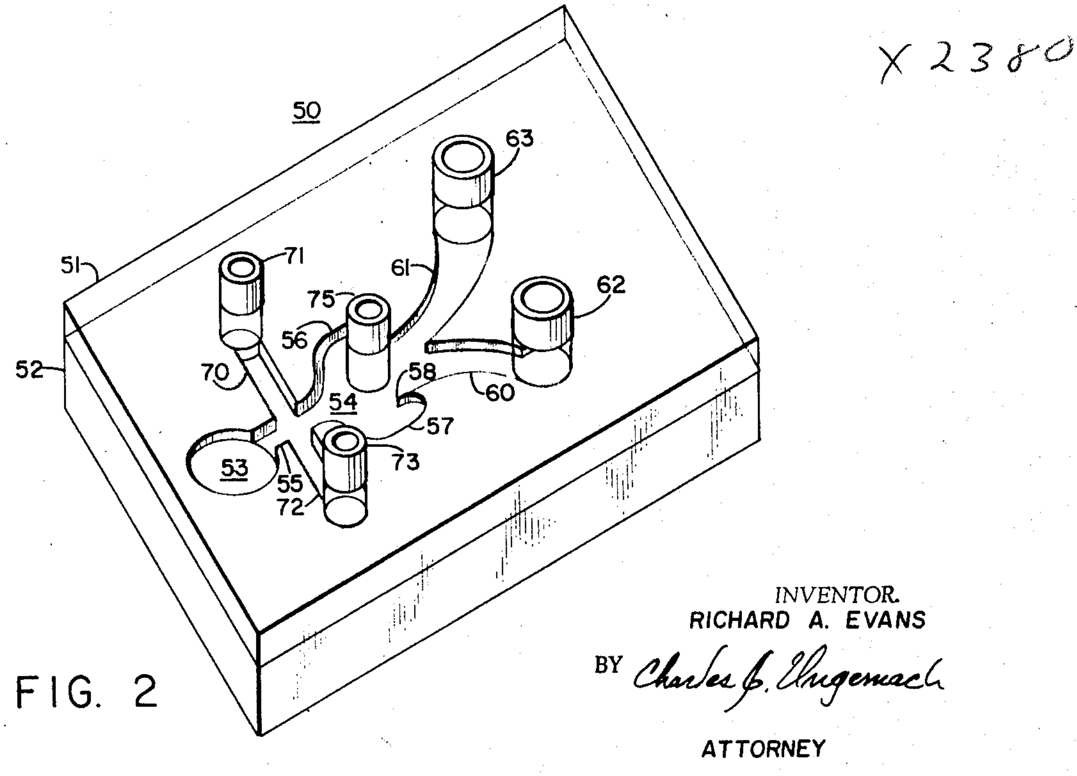

My invention will become apparent from a study of the accompanying specification and claims in conjunction with the drawings in which: FIGURE 1 is one embodiment of my gain changing amplifier; and FIGURE 2 is an alternate embodiment of my gain changing amplifier.

Referring now to FIGURE 1, reference numeral 10 generally depicts my gain changing amplifier. A transparent rectangular coverplate is identified by reference numeral 11. A rectangular housing 12 is positioned beneath coverplate 11 and is visible therethrough. Machined into housing 12 is my gain changing amplifier which comprises a fluid power plenum chamber 13, that is connected to a power source (not shown), for supplying a fluid to an interaction region 14 through a power nozzle 15. The interaction region 14 has two specially smoothly curved walls 16 and 17 for influencing internal feedback flows. An amplifier having internal feedback is more fully described in my copending application Ser. No.

347,850, filed Feb. 29, 1964 (now abandoned), and assigned to the same assignee as the present invention.

Connected to wall 16 is an outlet leg 18 and connected to wall 17 is an outlet leg 19. Located between outlet legs 18 and 19 is a splitter 20. Connected to the outlet leg 18 is a fluid chamber 25, having a boundary wall 26. Likewise connected to the outlet leg 19 is a fluid chamber 27 having a boundary wall 28. The output signal from the gain changing amplifier is obtained from chambers 25 and 27 through housing 12.

A pair of control ports 30 and 31 are shown oppositely disposed across the power nozzle 15. Fluid signals applied at control ports 30 and 31 cause the fluid stream from power nozzle 15 to be deflected into outlet legs 18 and 19 respectively.

A special inlet 40 is provided for supplying a fluid under pressure to interaction region 14. Inlet 40 is connected to a first passage 41 and a second passage 42 that connect respectively to passages 43 and 44, which in turn connect to passages 45 and 46. Passages 41, 43 and 45 transmit fluid from special inlet 40 to one side of interaction region 14 while passages 42, 44 and 46 transmit fluid from special inlet 40 to the opposite side of interaction region 14. With passages located on opposite sides of interaction region 14 a fluid supplied at special inlet 40 flows into interaction region 14 through passages 45 and 46 in equal amounts.

Referring now to FIGURE 2, reference numeral 50 generally identifies an alternate embodiment of my gain changing amplifier. A rectangular transparent cover element is indicated by a reference numeral 51 and a housing element is indicated by a reference numeral 52. The gain changing amplifier comprises a power plenum chamber 53 for supplying a fluid to an interaction region 54 through a power nozzle 55. The interaction region 54 has a chamber wall 56 and a chamber wall 57 each of which has a sharp point such as shown at 58 on the lower portion of the wall 57. The sharp point 58 on wall 57 peels off a portion of the fluid stream flowing through interaction region 14. A better understanding of this peel off type device may be had by reference to the aforementioned copending application. A pair of outlet legs 60 and 61 communicate with interaction chamber 54 adjacent to chamber wall 57 and 56 respectively.

Connected to outlet leg 60 is an output conduit 62 and likewise connected to outlet leg 61 is an output conduit 63. The output signal from the gain changing amplifier is obtained at output conduits 62 and 63. A pair of control ports 70 and 72 are oppositely disposed across power nozzle 55. Control port 70 is shown connected to a conduit 71 and is operable to deflect the fluid stream from power nozzle 55 into outlet leg 60. Control port 72 is connected to a conduit 73 is operable to deflect the fluid stream into outlet leg 61. A special inlet 75 is shown in communication with interaction region 54. Special inlet 75 is used to supply a fluid under pressure to interaction region 14 to thereby cause a change in the gain of the device.

In the operation of my gain changing amplifier shown in FIGURE 1, a fluid is supplied to chamber 13 from a source (not shown). The fluid flows through nozzle 15 into interaction chamber 14 and out either leg 18 or 19 or both. The fluid signal applied at control ports 30 and 31 determines the direction of the fluid stream flowing from nozzle 15. That is, if there is a larger pressure signal at control port 30 than at control port 31, there will be a tendency to deflect the fluid stream from power nozzle 15 into outlet leg 18. Conversely if there is a larger fluid signal at control port 31 that at 30 there will be a tendency to deflect the fluid stream from nozzle 15 into outlet leg 19.

Amplifier 10 is a proportional device. Thus, the output signal at chambers 25 and 27 varies in accordance with the input differential signal applied at control ports 30 and 31 and the gain of the amplifier. The gain of the amplifier is substantially constant over its normal operating range for any constant supply of fluid to special inlet 40. It should be noted that fluid pressures in passages 45 and 46 are equal so that no fluid differential signal is thereby produced across interaction region 14. Thus, for constant supplies of fluid to special inlet 40, the gain of amplifier 10 is substantially constant and the output signal at chambers 25 and 27 depends substantially only on the signal applied at control ports 30 and 31.

However, if the supply of fluid to inlet 40 is changed, the gain of the amplifier also changes for reasons which will hereinafter be discussed. Thus, the constant of proportionality by which the output signal of amplifier 10 differs from the input signal depends on the amount of fluid supplied to special inlet 40. For example, if the differential fluid signal applied at control ports 30 and 31 is 2 p.s.i. and the output differential fluid signal received at outlet legs 18 and 19 is 10 p.s.i. a pressure gain of 5 is present across the device. However, if additional fluid producing no pressure differential across the fluid stream issuing from power nozzle 15 is introduced into the interaction region 14 through passages 45 and 46, the output signal received by outlet legs 18 and 19 changes. Depending on the specific amplifier configuration and/or the amplifier operating point, the gain could increase or decrease. For example, with the same 2 p.s.i. differential at control ports 30 and 31 the output signal at outlets 25 and 27 may now be 8 p.s.i. differential instead of 10 p.s.i. (for the decreasing case) and hence the gain would be 4 instead of 5. Thus by addition of a fluid under pressure through the special inlet 40, the gain of the device has been decreased from 5 to 4. It is this technique of introducing a fluid into the interaction region 14 through the special inlet 40 (thus varying the local pressure), that causes the gain of the device to change and thereby perform the desired gain changing function through fluid control.

The exact reasons why the gain changes in the fluid amplifier when a fluid is supplied to the interaction region is quite complex and not fully understood. One of the possible explanations advanced for the change in gain is that changes in the feedback signals inherently present in a fluid amplifier cause changes in its gain. For example, under certain operation conditions of a fluid amplifier having a specially curved wall like that shown in FIGURE 1, the gain is decreased by the addition of more fluid to the interaction region 14 and under different operating conditions the gain may be increased by the addition of more fluid to the interaction region 14. It is known that the different operating conditions affect the inherent feedback flow patterns in the amplifier. In one case the additional flow may aid the feedback and in the other it may oppose. Therefore, it is probable that the introduction of fluid into the interaction region changes the amplifier gain by changing its internal feedback.

In the operation of the gain changing amplifier shown in FIGURE 2, a fluid stream issues from power nozzle 55 into interaction region 54 where it flows into outlet leg 60 and outlet leg 61. The relative amounts of fluid flowing into outlet legs 60 and 61 is determined by the control signal applied at control ports 70 and 72. For example, with a fluid stream issuing from nozzle 55, and a control signal of 2 p.s.i. differential at control ports 70 and 72, a differential output signal of 10 p.s.i. is present at outlets 62 and 63. Hence, the amplifier has a gain of 5. If a fluid is supplied to the interaction region 54 through the special inlet 75, causing the pressure to rise in the interaction region 54, the gain of the device changes. For example, with the same 2 p.s.i. differential at control ports 70 and 72, an addition of a fluid under pressure at inlet 75 may cause a decrease in the output signal to 6 p.s.i. at outlets 62 and 63 or a decrease of the gain from 5 to 3. Hence, by supplying a fluid to the interaction region 54 through the special inlet 75 the gain of the device can be altered.

I claim:

1. A method of changing the gain of a proportional fluid amplifier having an interaction region, a power nozzle and a pair of control ports for respectively supplying a power stream and control signals to the interaction region, and outlet means for receiving amplified fluid signals from the interaction region, the method comprising introducing additional fluid into the interaction region in a manner so as to change the effectiveness of the control signals in defecting the power stream, said additional fluid being introduced into the interaction region through a centrally located inlet, the additional fluid alone producing no pressure differential across the power stream.

2. A method of changing the gain of a proportional fluid device having an interaction region, a power nozzle and a pair of control ports for supplying a power stream and control signals to the interaction region and outlet means for receiving amplified fluid signals from the interaction region, the method comprising changing the fluid pressure in the interaction region by introducing additional fluid thereinto in a manner so that no differential output signals are caused thereby in the outlet means said additional fluid being introduced into the interaction region through a centrally located inlet.

References Cited

UNITED STATES PATENTS

| | | | |
|---|---|---|---|
| 3,159,168 | 12/1964 | Reader | 137—81.5 |
| 3,181,546 | 5/1965 | Boothe | 137—81.5 |
| 3,182,674 | 5/1965 | Horton | 137—81.5 |
| 3,191,860 | 6/1965 | Wadey | 137—81.5 XR |
| 3,228,410 | 1/1966 | Warren et al. | 137—81.5 |
| 3,272,215 | 9/1966 | Bjornsen et al. | 137—81.5 |
| 3,275,016 | 9/1966 | Wood | 137—81.5 |

SAMUEL SCOTT, *Primary Examiner.*